United States Patent
Mastantuono et al.

(10) Patent No.: US 9,401,727 B1
(45) Date of Patent: Jul. 26, 2016

(54) SHARED CIRCUIT CONFIGURATIONS FOR BOOTSTRAPPED SAMPLE AND HOLD CIRCUITS IN A TIME-INTERLEAVED ANALOG TO DIGITAL CONVERTER

(71) Applicant: Telefonaktiebolaget L M Ericsson (publ), Stockholm (SE)

(72) Inventors: Daniele Mastantuono, Lund (SE); Mattias Palm, Bara (SE); Roland Strandberg, Furulund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/838,012

(22) Filed: Aug. 27, 2015

(51) Int. Cl.
*H03M 1/12* (2006.01)
*G11C 27/02* (2006.01)
*H03K 17/06* (2006.01)
*H03M 1/00* (2006.01)
*H03M 1/08* (2006.01)

(52) U.S. Cl.
CPC ........... *H03M 1/1245* (2013.01); *G11C 27/024* (2013.01); *H03K 17/063* (2013.01); *H03M 1/002* (2013.01); *H03M 1/121* (2013.01); *H03M 1/0845* (2013.01)

(58) Field of Classification Search
CPC ... H03M 1/1245; H03K 17/06; H03K 17/063; H03K 17/04–17/04213; G11C 27/02; G11C 27/024
See application file for complete search history.

(56) References Cited

U.S. PATENT DOCUMENTS

| | | | |
|---|---|---|---|
| 6,072,355 A | 6/2000 | Bledsoe | |
| 6,724,236 B1* | 4/2004 | Sarraj | H03K 17/16 327/390 |
| 7,279,940 B1 | 10/2007 | Min | |
| 7,372,392 B1 | 5/2008 | Wan et al. | |
| 9,287,862 B2* | 3/2016 | Viswanath | H03K 17/063 |
| 2003/0016070 A1 | 1/2003 | Yang | |

(Continued)

FOREIGN PATENT DOCUMENTS

CN 103532534 A 1/2014
JP S57127307 A 8/1982

OTHER PUBLICATIONS

Xiaochen Yang et al., A 10 GS/s 6 b Time-Interleaved Partially Active Flash ADC, IEEE Transactions on Circuits and Systems—I: Regular Papers, vol. 61, No. 8, Aug. 2014.*

(Continued)

*Primary Examiner* — Howard Williams
(74) *Attorney, Agent, or Firm* — Coats & Bennett, PLLC

(57) ABSTRACT

In a time-interleaved Analog to Digital Converter, circuit components and capacitances may be shared among a plurality of sample and hold circuits in each of two sets. The two shared circuits alternate, on different half-periods of a master clock signal, between charging a capacitance and sampling an input in an overlapping manner such that one is charging while the other is sampling. One sample and hold circuit is activated during each successive half-period (following a charging half-period) by independent, sequential, non-overlapping clocking signals. To improve SNDR, at least one switch is bootstrapped by driving its gate terminal with the voltage of a capacitor configured between the gate and the input signal. By sharing at least some components among multiple sample and hold circuits, the number of gates driven by clock signals is reduced, reducing clock distribution and calibration complexity, and the circuit area is reduced.

10 Claims, 6 Drawing Sheets

(56) References Cited

U.S. PATENT DOCUMENTS

| | | |
|---|---|---|
| 2005/0073351 A1 | 4/2005 | Ko et al. |
| 2005/0164669 A1 | 7/2005 | Molnar et al. |
| 2010/0176857 A1 | 7/2010 | Kong et al. |
| 2010/0317308 A1 | 12/2010 | Mirzaei et al. |
| 2012/0252374 A1 | 10/2012 | Mattisson et al. |
| 2013/0141261 A1 | 6/2013 | Johancsik et al. |
| 2013/0234870 A1 | 9/2013 | Haque et al. |
| 2014/0378077 A1 | 12/2014 | Din et al. |

OTHER PUBLICATIONS

Wang Xinghua et al., An Optimized Design of Under-sampling IOOMHz-IOb Time-interleaved Pipelined ADC, 2010 2nd International Conference on Computer Engineering and Technology (ICCET) (vol. 3), IEEE, Apr. 2010.*

Chen et al. A High-performance Bootstrap Switch for Low Voltage Switched-Capacitor Circuits. 2014 IEEE International Symposium on Radio-Frequency Integration Technology, TH3B-3, pp. 1-3.

Chen et al. Optimization of Sample Hold Circuit for High-Speed and High-Resolution ADCs, ISIC, 2009.

\* cited by examiner

SHARED CIRCUIT CONFIGURATIONS FOR BOOTSTRAPPED SAMPLE AND HOLD CIRCUITS IN A TIME-INTERLEAVED ANALOG TO DIGITAL CONVERTER

FIELD OF INVENTION

The present invention relates generally to sample and hold circuits for time-interleaved analog to digital converters, and in particular to shared circuit configurations for bootstrapped sample and hold circuits.

BACKGROUND

Most modern electronic devices include at least some digital circuits. Technological advances have vastly increased the available processing power and memory density, while lowering the cost of both. While data-handling and computational circuits are naturally digital, even electronic circuits that were traditionally primarily analog—such as communication devices, signal processing circuits, control systems, and the like—are now often primarily digital, with analog-to-digital conversion (ADC) at the input, and digital-to-analog conversion (DAC) at the output.

As one representative, non-limiting example, consider a modern mobile wireless telecommunication device (e.g., smartphone), also known in the art as User Equipment (UE). Radio frequency signals received at an antenna may be amplified, filtered, and frequency downconverted by analog circuts, and are then converted to the digital domain. Many of the signal processing tasks—such as demodulation, data decoding, decryption, and the like—are performed digitally. The received digital data is processed by application programs, and may be converted to the analog domain and rendered to a speaker or display. Additionally, the device may receive analog signals from a microphone or camera, convert the signals to the digital domain, and perform inverse signal processing operations prior to generating analog RF signals, which are transmitted to the network. Similar RF signal processing tasks occur in the base station, also known as an eNodeB, of a wireless communication network—i.e., analog RF signals received at one or more antennas may be processed by analog circuits, and are then digitized for further processing, storage, transmission, and the like.

Increasingly high bandwidth and data rates (e.g., for 5G networks) impose the requirements of very high speed and accuracy in analog to digital data conversion. One known approach to improving ADC—at the cost of system complexity and power consumption—is time interleaving. In this approach, a number of lower-frequency sub-ADC circuits convert an analog input, and their outputs are combined at a higher sampling rate, to obtain the desired throughput.

FIG. 1 depicts the concept of time-interleaved ADC. A continuous time signal x(t) is converted to a digital signal y(n) using N sub-ADCs. Each sub-ADC converts the data to a sampling frequency 1/N that of the digital output y(n).

FIG. 2 shows a conventional circuit used to implement the time-interleaved ADC concept of FIG. 1. Each sub-ADC comprises a channel and a sampling input circuit. The sampling input circuit is represented with an ideal switch and a sampling capacitance. An input signal $V_{in}$ is rotated through the sub-ADCs by actuating the switches using successive clock signals $CK_1 \ldots CK_N$. The digital outputs of each sub-ADC are multiplexed to yield the digital output $D_{out}$. A clock circuit such as a Phase Locked Loop (PLL) or Digital Locked Loop (DLL) generates the clock signals.

A known limitation of ADC implementation is the Signal to Noise and Distortion Ratio (SNDR) that can be obtained, due to nonlinearity of the sampling switches. To achieve high resolution (e.g., 9 bits or more), the sampling switch must be linearized. One known approach to linearize a switch is to drive the gate of a transistor with a higher voltage that depends on the input signal, to approach a constant (signal independent) on-resistance. For example, if a sampling switch transistor receives a gate voltage of $V_{DD}$ $V_{in}$ and an input signal foltage at the source of $V_{in}$, then the gate-to-source voltage $V_{gs}$ is $V_g-V_s=(V_{DD}+V_{in})-V_{in}=V_{DD}$. This technique is known as bootstrapping. See, e.g., Marcel Pelgrom, *Analog-to-Digital Conversion*, §4.3.4 *CMOS Bootstrap Techniques* (Springer Science & Business Media, 2012), the disclosure of which is incorporated herein by reference. Bootstrap circuits solve two problems associated with a one-transistor switch: the limited input range due to the threshold voltage, and the switch resistance variation. Bootstrap circuits improve performance in both respects by increasing the effective drive voltage beyond the power supply limits.

FIG. 3 depicts a sub-ADC with a bootstrapped sampling switch. The switch M11 samples the Voltage $V_{in}$ applied to the capacitor ($C_S$ in FIG. 2). During a first half-period of the clock signal, when Clk is high, both M7 and M10 are turned on, charging the capacitor to $V_{DD}$, while M8 isolates the capacitor from the rest of the circuit, and M12 turns off switches M9 and M11. During the second half-period, when Clk is low, the capacitor is isolated from the power supply, and connected via M8 to the shared gate nodes of M9 and M11, which are isolated from ground by M12. This turns M9 and M11 on, connecting the input voltage $V_{in}$ to the capacitor and presenting their sum at the output $V_{out}$. The circuit thus operates over one complete period of the Clk signal—charging the capacitor in a first half-period, and sampling the input by adding it to $V_{DD}$ on the capacitor in a second half-period.

For each sampling switch M11, four equivalent transistor gate terminals (M7, M10, M12, and M8) must be driven by the clock generation circuits. A clock boosting circuit, such as a "boost" charge pump, drives the clock signal into the gate of switch M7 with a voltage that is greater than the power supply voltage. This is necessary to turn the gate "on"—that is, the gate voltage must be higher (by at least a threshold voltage $V_{th}$) than the voltage at its source, which is $V_{DD}$. Additionally, as described above, relating the excess voltage applied to the gate to the input voltage improves the linearity of the switch. The charge pump, of course, requires additional circuitry and increases power consumption.

FIG. 4 depicts a similar solution that does not require a charge pump to generate a bootstrap voltage in excess of the power supply. In this case, the input voltage $V_{in}$ is added to the power supply voltage, and the sum is applied to the gate of M7. Note that M7 is a PMOS device, as opposed to the NMOS device depicted in FIG. 3, since in this case when Clk is high, M12 drives the gate of M7 to ground. Otherwise, the circuit operates similarly to that described above. In this implementation, three gates must be driven (M10, M12, and M8). Although a charge pump is not necessary to boost the drive on M7, the switches M8 and M9, as well as the bootstrap capacitance, must increase in size to achieve the same SNDR as the implementation depicted in FIG. 4, thus reducing the area advantage of omitting the charge pump.

In many applications, improved performance, stability, linearity, and noise immunity are achieved by implementing circuits in a differential configuration. That is, rather than representing a signal value as a single voltage referenced to ground, the circuit is configured as mirror-image positive and negative sub-circuits, and the signal value is represented as the difference of two voltages. As used herein, with respect to differential circuits, the terms "positive" and "negative" are terms of reference used to identify the two complimentary halfs of a differential circuit, or the dual inputs or outputs (e.g., "positive input" or "negative output"). The terms do not indicate any value of, e.g., a voltage with respect to zero volts. If the sample and hold circuit of either FIG. 3 or 4 is implemented in a differential configuration, the circuit will be replicated to implement the positive and negative sub-circuits, and twice the capacitance must be driven. Thus, eight switches (FIG. 3) or six switches (FIG. 4) must be driven for each different sample and hold circuit. These numbers must then be multiplied by N, where N is the number of sub-ADCs in the time-interleaved ADC. Hence the total number of devices to be driven is 8N or 6N.

Additionally, such a large number of gates interconnections complicate the clock distribution required by introducing delays and imperfections. These require additional calibration circuitry to retime each sub-ADC. Conventional bootstrap ADC sub-circuits for a time-interleaved ADC thus suffer high gate count (8N or 6N), have complicated clock distribution and operation challenges, and consume large silicon area.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one embodiment, in which a higher-power supply voltage is available, a bootstrap circuit based on the configuration of FIG. 3 is implemented using an inverter receiving the higher-power supply voltage (e.g., $2 \times V_{DD}$). The bootstrap capacitance and the switches M7, M9, and M10 are shared among circuits in each of two sets of sample and hold circuits. The two shared circuits alternately charge their respective shared capacitance during opposite half-periods of a master clock signal, and share the charge to the active sample and hold circuit during the other half-period. The two shared circuit thus operate in an overlapping fashion, with one circuit charging the shared capacitance while the other circuit is sampling, and vice versa. During the respective sampling half-period, one of the N/2 sample and hold circuits connected to each shared circuit is activated by a dedicated sampling clock pulse. The sampling clock pulses are one half-period of the master clock signal, and are sequential and non-overlapping; hence the sample and hold circuits are active mutually exclusively. During a sampling operation, the shared (and previously charged) capacitance is placed in series between the input terminal and the gate terminal of a sampling transistor M11, thus improving its linearity. In each differential sample and hold circuit, the enabling switch M12 is shared between the positive and negative sub-circuits. In this embodiment, the number of gates to be driven by the clock generation circuitry is reduced from 8N to 3*N+10, and the capacitances are reduced from 2*N to 4. For N>2, the complexity of the clock distribution is reduced, eliminating the sources of imperfections, and thus relaxing the calibration requirements, as well as minimizing the area.

According to another embodiment, in which a separate, higher-power supply voltage is not available, a bootstrap circuit based on the configuration of FIG. 4 is implemented. This embodiment operates similarly, with two shared circuits operating on opposite half-periods of the master clock, each shared circuit driving a plurality of individually-clocked sample and hold circuits. In this embodiment, since the bootstrap effect is generated only when a sample and hold circuit is active (adding the input voltage to the supply voltage), fewer gates can be shared. In particular, M10 is shared among the sample and hold circuits of each of two sets, and the enabling switch M12 is shared between the positive and negative sub-circuits of each differential sample and hold circuit. In this embodiment, the number of gates to be driven by the clock generation circuitry is reduced from 6N to 3*N+2. For N>2, the complexity of the clock distribution is reduced, eliminating the sources of imperfections, and thus relaxing the calibration requirements.

One embodiment relates to a time-interleaved, bootstrapped sample and hold apparatus comprising an input terminal and four output terminals. The apparatus includes first, second, third, and fourth sample and hold circuits, each connected to the input terminal and a different output terminal, The first, second, third, and fourth sample and hold circuits are mutually exclusively operative to sample a voltage at the input terminal in response to respective first, second, third, and fourth sample clock signals, each asserted for one different half-period of every two successive periods of a master clock signal. The apparatus further includes a first shared circuit operative to charge a first capacitance during one half-period of each period of a master clock signal, and a second shared circuit operative to charge a second capacitance during the other half-period of each period of a master clock signal. The first and third sample and hold circuits are connected to the first shared circuit, and the first capacitance is connected between the input terminal and a gate terminal of a sampling transistor in, alternately, one of the first and third sample and hold circuits, in response to the respective first and third sample clock signals, during half-periods of the master clock in which the first shared circuit is not charging the second capacitance. The second and fourth sample and hold circuits are connected to the second shared circuit, and the second capacitance is connected between the input terminal and a gate terminal of a sampling transistor in, alternately, one of the second and fourth sample and hold circuits, in response to the respective second and fourth sample clock signals, during half-periods of the master clock in which the second shared circuit is not charging the second capacitance.

Another embodiment relates to a method of operating a time-interleaved sample and hold circuit apparatus comprising first and second shared circuits, each operative to charge a capacitance during opposite half-periods of a master clock signal, wherein each shared circuit is connected to two or more independently-activated sample and hold circuits. During a first half-period of a master clock signal, the first shared circuit is configured to charge a first capacitance and simultaneously, the second shared circuit is configured to sample an input voltage at one sample and hold circuit connected to it. During an immediately successive second half-period of the master clock signal, the second shared circuit is configured to charge a second capacitance and the first shared circuit is simultaneously configured to sample an input voltage at one sample and hold circuit connected to it. When either the first or second shared circuit is sampling an input voltage at one sample and hold circuit connected to it, the sample and hold circuit is configured such that the respective first or second capacitance is connected between the input voltage and a gate terminal of a sampling transistor in the sample and hold circuit.

Still another embodiment relates to a time-interleaved Analog-to-Digital Converter (ADC). The ADC includes a time-interleaved, bootstrapped sample and hold apparatus according to claim 1. The ADC additionally includes first, second, third, and fourth digitizing circuits connected to respective output terminals of the sample and hold apparatus, and a multiplexing circuit operative to generate a digital output by multiplexing the outputs of the first, second, third, and fourth digitizing circuits.

Yet another embodiment relates to an electronic device. The device includes one or more analog inputs; a time-interleaved Analog-to-Digital converter comprising a time-interleaved, bootstrapped sample and hold apparatus according to claim 1; and a digital processing circuit.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

U.S. patent application Ser. No. 14/838,044, titled, "Low Power and Area Bootstrapped Passive Mixer with Shared Capacitances," assigned to assignee of the present application and filed concurrently herewith, discloses another application of shared circuits in the bootstrap operation of transistors, and its disclosure is incorporated herein by reference, in its entirety.

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
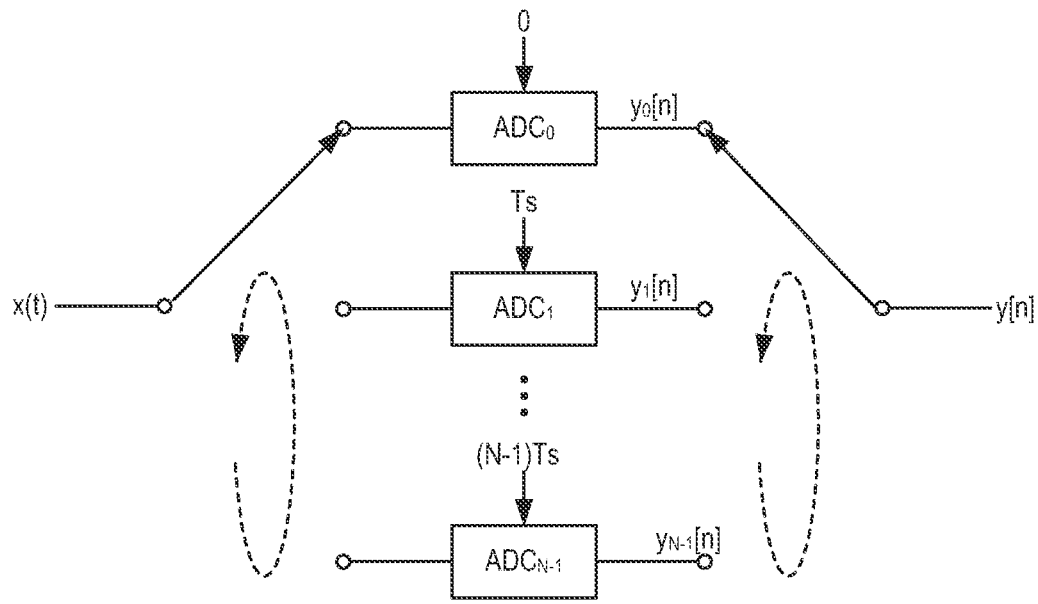
FIG. 1 is a conceptual block diagram of a time-interleaved analog to digital converter.
Figure 2:
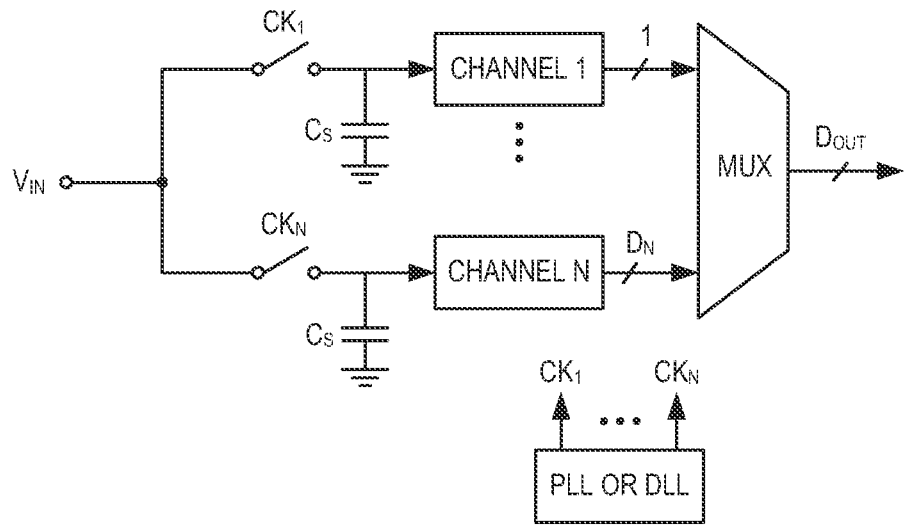
FIG. 2 is a functional block diagram of a time-interleaved ADC.
Figure 3:
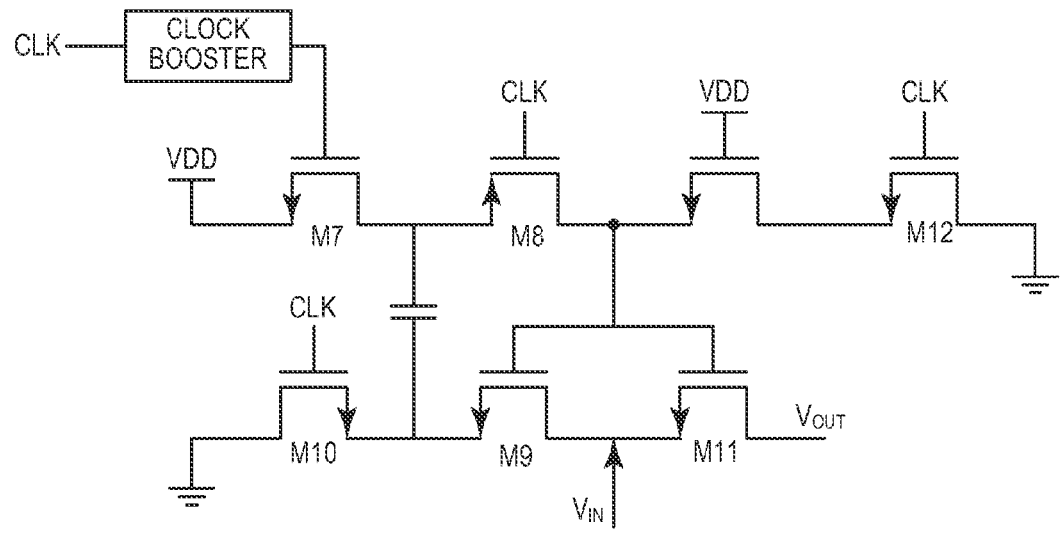
FIG. 3 is a schematic diagram of a bootstrapped sample and hold circuit utilizing a voltage boost circuit.

An inventive, time-interleaved, bootstrapped, sample and hold circuit configuration according to FIG. 3 (applicable when a higher-voltage supply is available) is first described in detail. A configuration according to FIG. 4—in which only a single supply voltage is available—is then described.

Figure 5:
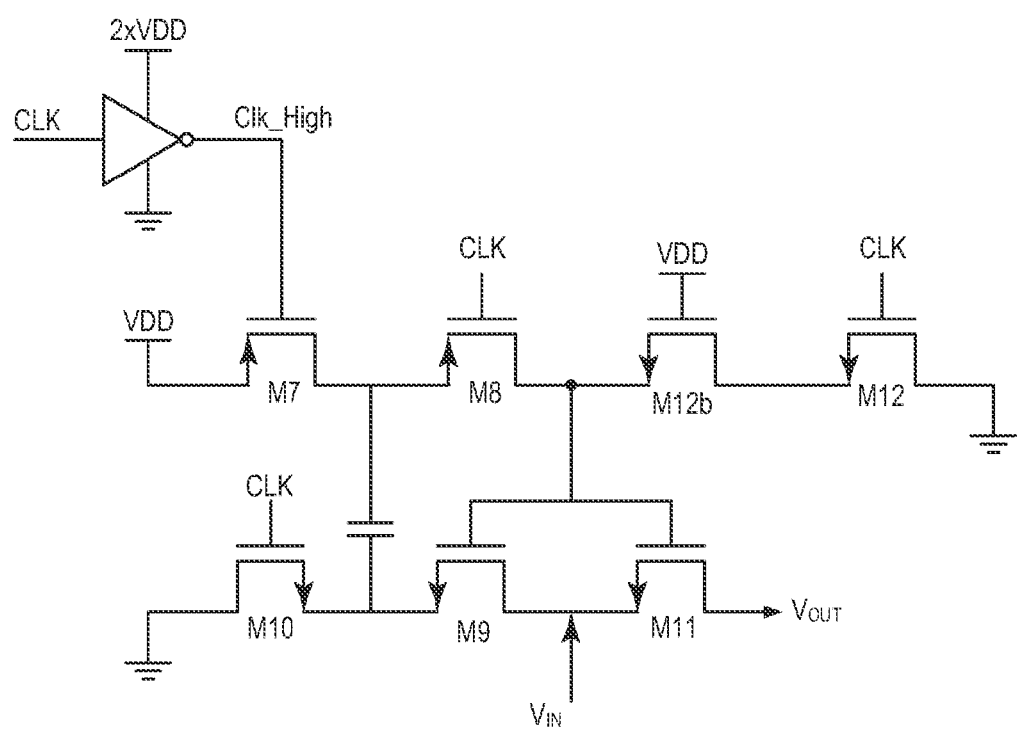
FIG. 5 is a schematic diagram of a bootstrapped sample and hold circuit using an inverter as a bootstrap circuit.

FIG. 5 depicts a sample and hold circuit similar to FIG. 3, but in which a charge pump is not required to boost the supply voltage. Rather, an inverter receives a higher-voltage supply, and inverts the clock signal. The higher-voltage clock signal Clk_High then drives the gate of M7 to pull the gate voltage higher than its source voltage, and hence turn the gate on. Note that, since Clk_High is the output of an inverter, it is 180° out of phase with the inverter input Clk; hence, gate M7 is a PMOS type. The circuit of FIG. 5 assumes a higher-voltage supply is available, as is often the case in real-world ADC designs, particularly where input buffers need to handle high amplitude signals with high linearity. A higher-voltage of twice $V_{DD}$ is assumed, if the clock signal amplitude is equal to $V_{DD}$. In general, a higher-voltage supply value of $V_{DD}+A_{in}$ is sufficient, where $A_{in}$ is the amplitude of the signal at the input of the sample and hold circuit of the ADC.

In the circuit of FIG. 5, both the switches M7 and M9 can be driven by a clock independently of the input signal. Accordingly, it is possible to share these gates among a plurality of sample and hold circuits.

Figure 6:
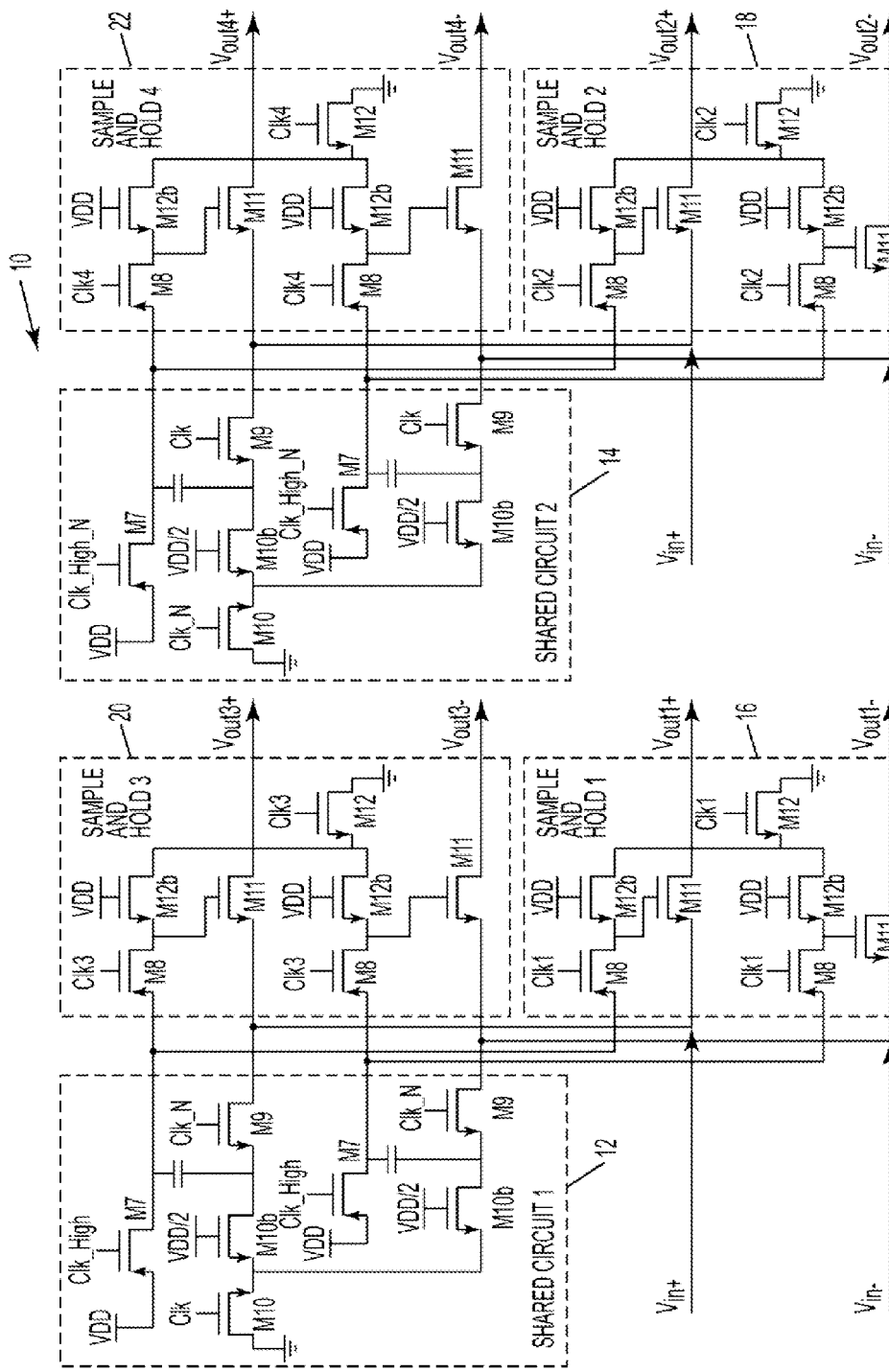
FIG. 6 is a schematic diagram of a sample and hold circuit for a time-interleaved ADC, having two shared circuits and receiving a higher-voltage bootstrap clock signal.

FIG. 6 depicts one embodiment of a time-interleaved bootstrapped analog to digital circuit apparatus 10. In this apparatus 10, two shared circuits 12 and 14 each drive a plurality of sample and hold circuits 16, 18, 20, 22, with the "odd" first and third sample and hold circuits 16, 20 connected to the first shared circuit 12, and the "even" second and fourth sample and hold circuits 18, 22 connected to the second shared circuit 12. The sample and hold circuits 16, 18, 20, 22 may be the sampling front-ends of sub-ADCs of a time-interleaved Analog to Digital Converter; however, in this discussion they are each referred to as sample and hold circuits. All of the circuits are configured as differential circuits, with positive and negative sub-circuits, although the inventive concepts and techniques apply to single-ended circuits. Indeed, in the following discussion, except where the differential operation is particularly relevant, only the positive sub-circuits are referenced, for simplicity and clarity of explanation.

In particular, the time-interleaved, bootstrapped analog to digital circuit apparatus 30 comprises first, second, third, and fourth sample and hold circuits 16, 18, 20, 22, each connected to an input terminal $V_{in+}$, and a different output terminal $V_{out1+}$, $V_{out2+}$, $V_{out3+}$, $V_{out4+}$. The sample and hold circuits 16, 18, 20, 22 are mutually exclusively operative to sample a voltage at the input terminal $V_{in}$, in response to respective first, second, third, and fourth sample clock signals $Clk_1$, $Clk_2$, $Clk_3$, $Clk_4$, each asserted for one different half-period of every two successive periods of a master clock signal Clk, as discussed in greater detail herein.

A first shared circuit 12 is operative to charge a first capacitance during one half-period of each period of a master clock signal Clk, and a second shared circuit 14 is operative to charge a second capacitance during the other half-period of each period of a master clock signal Clk.

As stated above, the first and third sample and hold circuits 16, 20 are connected to the first shared circuit 12, and the first capacitance is connected between the input terminal $V_{in+}$ and a gate terminal of the sampling transistor M11 in, alternately, one of the first and third sample and hold circuits 16, 20, in response to the respective first and third sample clock signals Clk$_1$, Clk$_3$, during half-periods of the master clock Clk in which the first shared circuit 12 is not charging the first capacitance. Similarly, the second and fourth sample and hold circuits 18, 22 are connected to the second shared circuit 14, and the second capacitance is connected between the input terminal V$_{in+}$ and a gate terminal of the sampling transistor M11 in, alternately, one of the second and fourth sample and hold circuits 18, 22, in response to the respective second and fourth sample clock signals Clk$_2$, Clk$_4$, during half-periods of the master clock Clk in which the second shared circuit 14 is not charging the second capacitance.

The overlapping, "ping-pong" style operation of the first and second shared circuits 12, 14 is described, prior to a detailed discussion of the operation of the first—fourth sample and hold circuits 16, 18, 20, 22. The switch M7 is driven in the first shared circuit 12 with the higher-voltage clock signal Clk_High, and in the second shared circuit 14 with its inverse Clk_High_N. These may be generated by an inverter receiving a higher-voltage supply (not shown), as depicted in FIG. 5, and accordingly are 180° out of phase with the master clock signal Clk. Additionally, in the first shared circuit 12, switch M10 is driven by Clk, and switch M9 is driven by its inverse Clk_N; the reverse is true of these switches in the second shared circuit 14. Accordingly, the first and second shared circuits 12, 14, operate complimentarily, but on opposite half-periods of the master clock signal.

That is, in a first half-period, when Clk=1, Clk_N=0, Clk_High=0, and Clk_High_N=1, the first shared circuit 12 charges the first capacitance by connecting the capacitor to the power supply through M7 and M10, and isolating the capacitor from the sample and hold circuits 16, 20 by M9. During this first half-period, the capacitor in the second shared circuit 14 is isolated from the power supply by M7 and M10, and is shared with the active one of second and fourth sample and hold circuits 18, 22 by M9 (as described in greater detail herein, only one sample and hold circuit 16, 18, 20, 22 is active during any master clock half-period, via the clock signals Clk$_1$-Clk$_4$ depicted in FIG. 7—that is, their operation is mutually exclusive).

In the second half-period, when Clk=0, Clk_N=1, Clk_High=1, and Clk_High_N=0, the first and second shared circuits 12, 14 perform opposite functions. In particular, the second shared circuit 14 charges the second capacitance by connecting the capacitor to the power supply through M7 and M10, and isolating the capacitor from the sample and hold circuits 18, 22 by M9. At the same time, the capacitor in the first shared circuit 12 is isolated from the power supply by M7 and M10, and is shared with the active one of first and third sample and hold circuits 16, 20 by M9.

Each sample and hold circuit requires a full cycle of the master clock signal Clk to sample a voltage—one half-period to charge the capacitance and the next half-period to sample the input. By providing two shared circuits 12, 14 and connecting each to opposite phases of the master clock Clk, the shared circuits (together with an active one of the sample and hold circuits connected to them) overlap these phases, producing a new sample every half-period.

In each of the first and second shared circuits 12, 14, switch M10b is inserted to isolate the two differential inputs V$_{in+}$ and V$_{in-}$ when M9 of the same differential sample and hold circuit are closed. These inputs should never be short-circuited. When a shared circuit 12, 14 is in the sample phase, M10 is open and M9 is closed. This creates a short circuit path via M9-M10b-M10b-M9. By applying the proper gate voltage to M10b, it can be assured that at least one of the M10b switches will be off, breaking this short-circuit path. Assuming the input signals have a DC of V$_{DD}$/2, biasing the gate of M10b at V$_{DD}$/2 gives the best isolation. That is, assume V$_{in+}$=V$_{DD}$/2+V$_{in}$ and V$_{in-}$=V$_{DD}$/2−V$_{in}$. If the gate voltage of M10b is set to V$_{DD}$/2, then at least one of the M10b switches will have a gate-source voltage lower than 0, ensuring that it is off during the sampling phase.

Also, within each differential sample and hold circuit 16, 18, 20, 22, the switch M12, which disables the outputs, is shared between the positive and negative sub-circuits.

Figure 7:
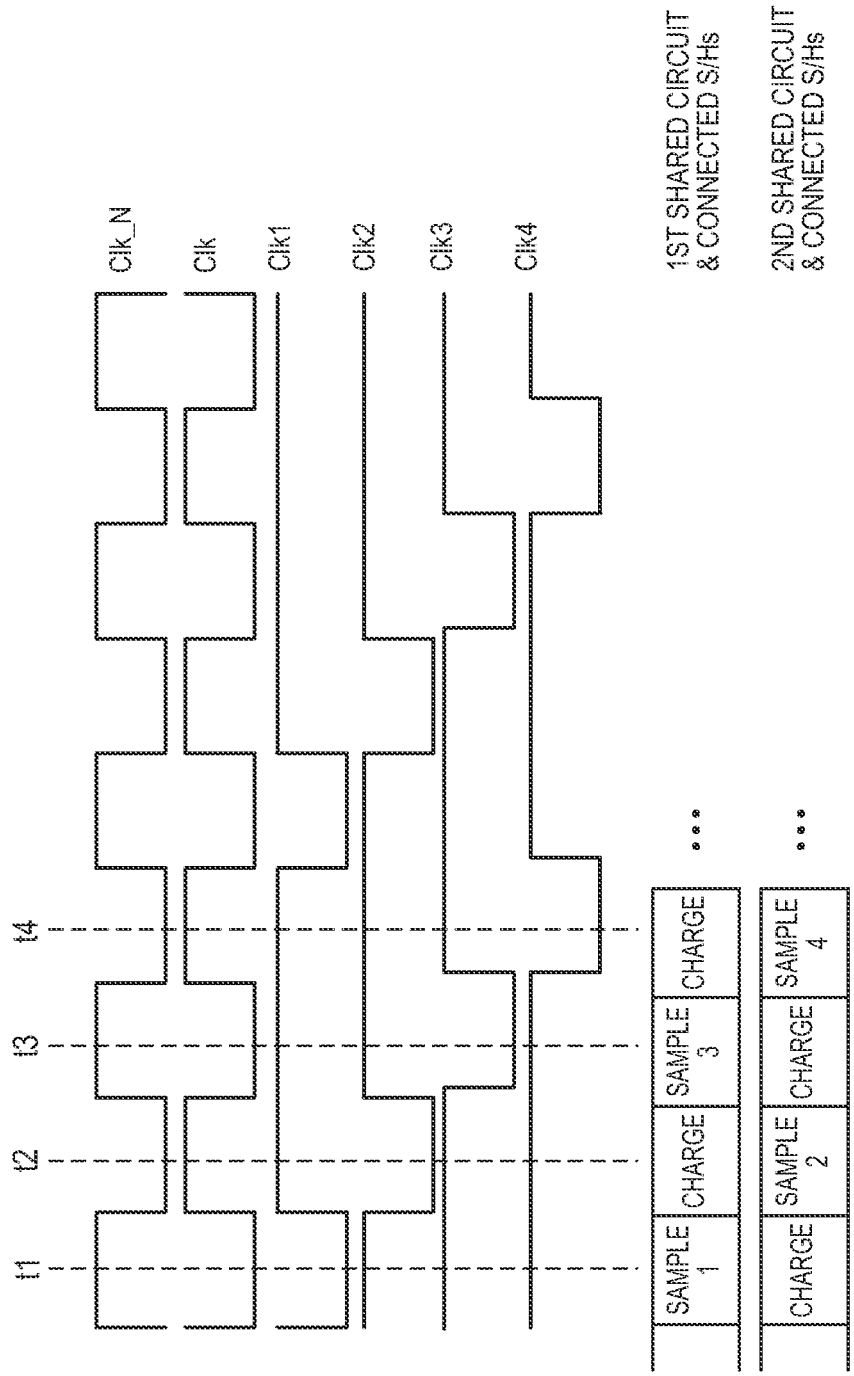
FIG. 7 is a timing diagram of clock signals for the ADC of FIG. 6.

Generation of the individual sample clock signals Clk$_1$-Clk$_4$, and operation of the sample and hold circuits 16, 18, 20, 22, will now be described in greater detail. FIG. 7 depicts the relationship between the master clock signal Clk (and its inverse Clk_N) and four sample clock signals Clk$_1$-Clk$_4$. Each sample clock signal Clk$_1$-Clk$_4$ is active (e.g., low) during only one half-period out of every two successive periods of master clock signal Clk. The sample clock signals Clk$_1$-Clk$_4$ are active successively, in a non-overlapping pattern; accordingly, the corresponding sample and hold circuits 16, 18, 20, 22 mutually exclusively active—that is, no two are active at any one time. Additionally, over each full period of the master clock signal Clk, one "odd" sample clock signal is active, and one "even" one. In the embodiment of FIG. 6, the odd sample and hold circuits one (16) and three (20) share the first shared circuit 12, and the even sample and hold circuits two (18) and four (22) share the second shared circuit 14. The operation of the time-interleaved sample and hold circuit apparatus 10 depicted in FIG. 6 is described in detail with reference to the time periods t$_1$-t$_4$ depicted in FIG. 7.

During t$_1$ the switches M8 and M11 of the first sample and hold circuit 16 and the switches M9 of the first shared circuit 12 are closed, sampling the input signal V$_{in+}$ at the output V$_{out1+}$ (as described below). Also during this half-period, M7 and M10 of the second shared circuit 14 charge the bootstrap capacitor to V$_{DD}$. Switches in the other sample and hold circuits 18, 20, 22 are kept open by M12.

During t$_2$ the switches M8 and M11 of the second sample and hold circuit 18 and the switches M9 of the second shared circuit 14 are closed, sampling the input signal at V$_{out2+}$. Considering only one of the differential pair for simplicity, the bootstrap capacitance of the second shared circuit 14 was charged to V$_{DD}$ during t$_1$. One node of the capacitor is applied, through M8, to the gate of the sampling transistor M11. The other node is connected, through M9, to the input signal. The capacitor is thus connected between the input terminal and a gate terminal of the sampling transistor M11. The input signal is applied to the source of M11, and this value is sampled at the drain of M11 as the output signal. Because the voltage at the gate of the sampling transistor M11 is the capacitance voltage boosted (or diminished) by the same input voltage applied to the source of M11, the transistor M11 is highly linear. Also during this half-period, M7 and M10 of the first shared circuit 12 charge the bootstrap capacitor to V$_{DD}$. Switches in the other sample and hold circuits 16, 20, 22 are kept open by M12.

During t$_3$ the switches M8 and M11 of the third sample and hold circuit 20 and the switches M9 of the first shared circuit 12 are closed, sampling the signal at V$_{out3+}$. The sampling is done by adding the input signal V$_{in}$ to V$_{DD}$ on the capacitance of the first shared circuit 12, which was charged to V$_{DD}$ during t$_2$. Also during this half-period, M7 and M10 of the second shared circuit 14 charge the bootstrap capacitor to V$_{DD}$. Switches in the other sample and hold circuits 16, 18, 22 are kept open by M12.

During t$_4$ the switches M8 and M11 of the fourth sample and hold circuit 22 and the switches M9 of the second shared circuit 14 are closed, sampling the signal at V$_{out4+}$. The sampling is done by adding the input signal $V_{in}$ to $V_{DD}$ on the capacitance of the second shared circuit 14, which was charged to $V_{DD}$ during $t_3$. Also during this half-period, M7 and M10 of the first shared circuit 12 charge the bootstrap capacitor to $V_{DD}$. Switches in the other sample and hold circuits 16, 18, 20 are kept open by M12. This pattern then repeats.

The blocks below the timing diagram of FIG. 7 depict the overlapped nature of the "sample n" and "charge" operations of the first and second shared circuits 12, 14 (and their connected sample and hold circuits 16, 20 and 18, 22, respectively).

The extension to a greater number of sample and hold circuits is straightforward. While at least two sets are required—that is, at least first and second shared circuits 12, 14—to implement the overlapped operations of charging and sampling, so as to yield a new sample every half-period, operationally there is no limit to the number of sample and hold circuits that can be added. That is, the first shared circuit 12 may be connected to the first and third sample and hold circuits 16, 20, and additionally fifth, seventh, ninth, etc. sample and hold circuits. Similarly, sixth, eighth, tenth, etc. sample and hold circuits may be additionally connected to the second shared circuit 14. The only limitations on the number of sample and hold circuits that may be shared with each of the first and second shared circuits 12, 14 are conventional engineering considerations of fan-out, wiring congestion, clock distribution, and the like.

In the apparatus 10, the number of capacitances and bootstrapped switches M7 are both reduced for a differential, N channel time-interleaved ADC from 2N to 4, compared to conventional implementations (e.g., FIG. 3). Additionally, the number of gates to be driven is reduced from 8N to 3N+10. This simplifies the clock distribution and reduces silicon area.

Figure 8:
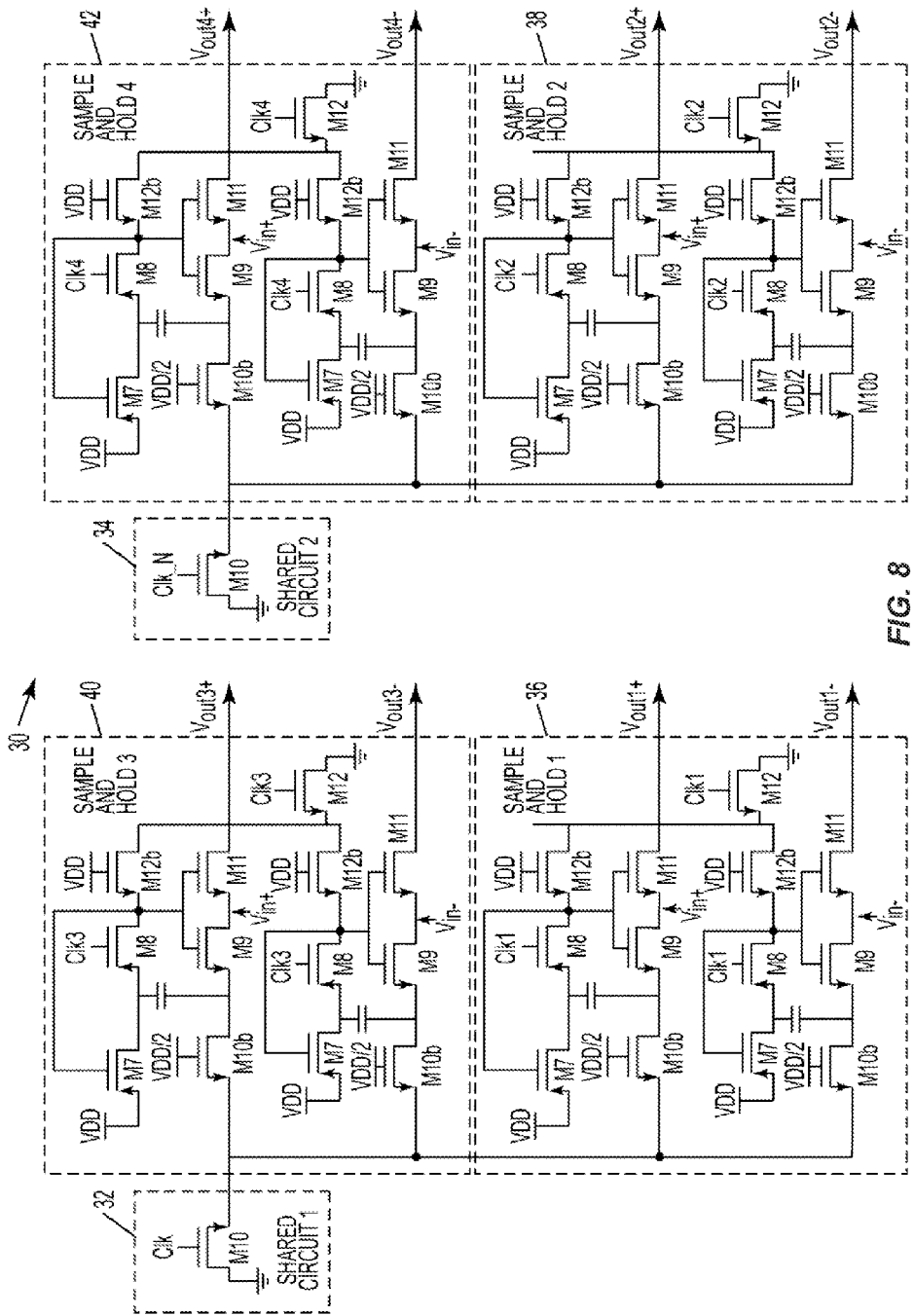
FIG. 8 is a schematic diagram of a sample and hold circuit for a time-interleaved ADC, having two shared circuits and that does not receive a higher-voltage bootstrap clock signal.

FIG. 8 depicts another embodiment of a time-interleaved analog to digital circuit apparatus 30. In this embodiment, a higher-voltage supply is not available, and each sample and hold circuit is bootstrapped according to the circuit of FIG. 4. In this apparatus 30, two shared circuits 32 and 34 each drive a plurality of sample and hold circuits 36, 38, 40, 42. The sample and hold circuits 36, 38, 40, 42 may be front-end sampling circuits of sub-ADCs of a time-interleaved Analog to Digital Converter (not shown); however, in this discussion they are each referred to as sample and hold circuits. All of the circuits are configured as differential circuits, with positive and negative sub-circuits, although the inventive concepts and techniques apply to single-ended circuits. Indeed, as above, only the positive sub-circuit is discussed below for simplicity and dainty, except where the discussion relates to the differential nature of the circuits. The extension to the differential circuit operation of the apparatus 30 of FIG. 8 is straightforward to those of skill in the art.

This apparatus 30 operates similarly to the apparatus 10 described above with respect to FIG. 6, with one shared circuit 32, 34 charging a capacitance in one half-period of a master clock signal Clk while the other shared circuit 32, 34 shares the capacitor voltage to one active sample and hold circuit 36, 38, 40, 42. In the following half-period, the shared circuits 32, 34 swap these operations. However, in the apparatus 30, because switches M7 and M9 are connected to the gate of sampling switch M11, they cannot be shared between different sample and hold circuits 36, 40 and 38, 42 of each set, and are instead replicated within each sample and hold circuit 36, 38, 40, 42. This forces isolation switch M10b to also reside in each sample and hold circuit 36, 38, 40, 42. Accordingly, only the grounding switch M10 is shared in each of the first and second shared circuits 32, 34. As in the apparatus 10, in each differential sample and hold circuit 36, 38, 40, 42, one enabling switch M12 is shared between the positive and negative sub-circuits. The sharing of these circuit components reduces the number of switches driven by clock signals, and reduces the area, over conventional implementations.

The sample and hold circuits 36, 38, 40, 42 are each independently activated—that is, they operate mutually exclusively—using the same independent, sequential, non-overlapping sample clock signals $Clk_1$-$Clk_4$ depicted in FIG. 7. The operation of four sample and hold circuits 36, 38, 40, 42 is described below, over two full periods of the master clock signal.

During $t_1$ the clock signal $Clk_1$ closes switches M9 and M11 in the first sample and hold circuit 36, and $V_{in+}$ is sampled at the output $V_{out1+}$. The bootstrapped switch M7 is driven by a voltage $V_{DD}+V_{in}$, to raise its gate voltage above $V_{DD}$ at its source, without requiring a separate supply voltage value. The capacitor is connected between the input voltage $V_{in+}$ and the gate terminal of the sampling switch M11. Because the voltage at the gate of the sampling transistor M11 is the capacitance voltage boosted (or diminished) by the same input voltage applied to the source of M11, the transistor M11 is highly linear. The sampling switches in the second through fourth sample and hold circuits 38, 40, 42 are held open by M12. In the second shared circuit 34, the inverted master clock signal Clk_N drives M10 to charge the bootstrap capacitances in the second and fourth sample and hold circuits 38, 42 to $V_{DD}$.

During $t_2$ the clock signal $Clk_2$ closes switches M9 and M11 in the second sample and hold circuit 38, and $V_{in+}$ is sampled at the output $V_{out2+}$. The sampling switches in the first, third, and fourth sample and hold circuits 36, 40, 42 are held open by M12. In the first shared circuit 32, the master clock signal Clk drives M10 to charge the bootstrap capacitances in the first and third sample and hold circuits 36, 40 to $V_{DD}$.

During $t_3$ the clock signal $Clk_3$ closes switches M9 and M11 in the third sample and hold circuit 40, and $V_{in+}$ is sampled at the outputs $V_{out3+}$. The sampling switches in the first, second, and fourth sample and hold circuits 36, 38, 42 are held open by M12. In the second shared circuit 34, the inverted master clock signal Clk_N drives M10 to charge the bootstrap capacitances in the second and fourth sample and hold circuits 38, 42 to $V_{DD}$.

During $t_4$ the clock signal $Clk_4$ closes switches M9 and M11 in the fourth sample and hold circuit 42, and $V_{in+}$ is sampled at the outputs $V_{out4+}$. The sampling switches in the first through third sample and hold circuits 36, 38, 40 are held open by M12. In the first shared circuit 32, the master clock signal Clk drives M10 to charge the bootstrap capacitances in the first and third sample and hold circuits 36, 40 to $V_{DD}$.

The blocks below the timing diagram of FIG. 7 depict the overlapped nature of the "sample n" and "charge" operations of the first and second shared circuits 32, 34 (and their connected sample and hold circuits 36, 40 and 38, 42, respectively).

As with apparatus 10, the extension of apparatus 30 to a greater number of sample and hold circuits is straightforward—any number of "odd" sample and hold circuits may be connected to the first shared circuit 32, with any number of "even" sample and hold circuits connected to the second shared circuit 34, limited only by conventional engineering constraints. Of course, additional $Clk_N$ signals must be generated, as in FIG. 7.

Figure 4:
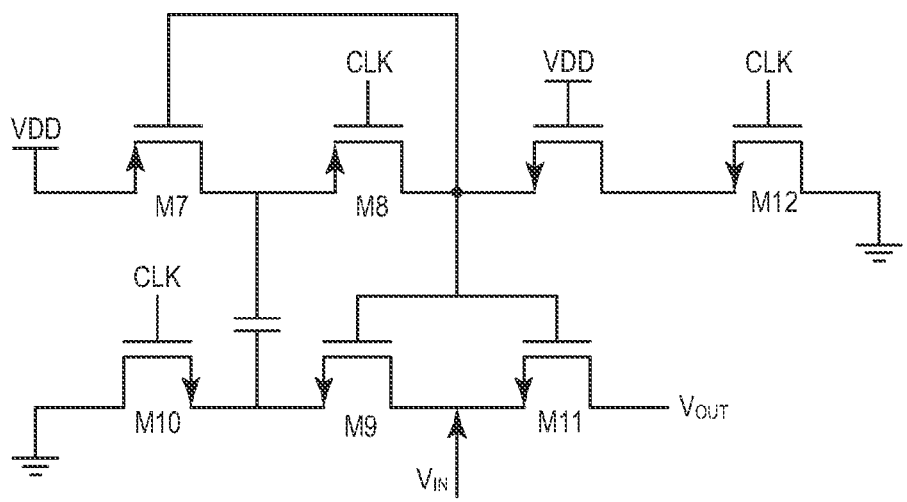
FIG. 4 is a schematic diagram of a bootstrapped sample and hold circuit without the boost circuit if FIG. 3.

In the general case of an N channel time-interleaved ADC, with N≥2, the switch M10 will be driven by a frequency N times higher than conventional circuits (e.g., FIG. 4). This allows a reduction of the number of M10 switches from N to 2, while the number of M12 switches is reduced from N to N/2. In this way the clock distribution is simplified, reducing the number of gates to be driven by the clock from 6N to 3N+2.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A time-interleaved, bootstrapped sample and hold apparatus comprising an input terminal and four output terminals, comprising:
   first, second, third, and fourth sample and hold circuits, each connected to the input terminal and a different output terminal, and mutually exclusively operative to sample a voltage at the input terminal in response to respective first, second, third, and fourth sample clock signals, each asserted for one different half-period of every two successive periods of a master clock signal;
   a first shared circuit operative to charge a first capacitance during one half-period of each period of a master clock signal; and
   a second shared circuit operative to charge a second capacitance during the other half-period of each period of a master clock signal;
   wherein the first and third sample and hold circuits are connected to the first shared circuit, and wherein the first capacitance is connected between the input terminal and a gate terminal of a sampling transistor in, alternately, one of the first and third sample and hold circuits, in response to the respective first and third sample clock signal, during half-periods of the master clock in which the first shared circuits is not charging the first capacitance; and
   wherein the second and fourth sample and hold circuits are connected to the second shared circuit, and wherein the second capacitance is connected between the input terminal and a gate terminal of a sampling transistor in, alternately, one of the second and fourth sample and hold circuits, in response to the respective second and fourth sample clock signals, during half-periods of the master clock in which the second shared circuit is not charging the second capacitance.

2. The apparatus of claim 1 wherein, for each two consecutive periods of the master clock, comprising four consecutive half-periods,
   the first sample clock signal, which clocks the first sample and hold circuit, is active only during a first half-period of the master clock;
   the second sample clock signal, which clocks the second sample and hold circuit, is active only during a second half-period of the master clock;
   the third sample clock signal, which clocks the third sample and hold circuit, is active only during a third half-period of the master clock; and
   the fourth sample clock signal, which clocks the fourth sample and hold circuit, is active only during a fourth half-period of the master clock.

3. The apparatus of claim 1 wherein each of the first, second, third, and fourth sample and hold circuits are differential circuits comprising positive and negative sub-circuits each connected to a positive and negative input terminal and each generating a positive and negative voltage output, and wherein both sub-circuits of each sample and hold circuit share an enabling circuit.

4. The apparatus of claim 1 wherein each of the first and second shared circuits are differential circuits comprising positive and negative sub-circuits.

5. The apparatus of claim 1 wherein the first and second shared circuits each comprise a switch between ground and the respective sample and hold circuits, and wherein, for each period of the master clock signal, the switch in the first shared circuit is enabled during the first half-period of the master clock signal and the switch in the second shared circuit is enabled during the second, opposite half-period of the master clock signal.

6. A time-interleaved Analog-to-Digital converter comprising:
   a time-interleaved, bootstrapped sample and hold apparatus according to claim 1;
   first, second, third, and fourth digitizing circuits connected to respective output terminals; and
   a multiplexing circuit operative to generate a digital output by multiplexing the outputs of the first, second, third, and fourth digitizing circuits.

7. An electronic device, comprising:
   one or more analog inputs;
   a time-interleaved Analog-to-Digital converter comprising a time-interleaved, bootstrapped sample and hold apparatus according to claim 1; and
   a digital processing circuit.

8. The device of claim 7, wherein the device comprises User Equipment operative in a wireless communication network.

9. The device of claim 7, wherein the device comprises a base station node of a wireless communication network.

10. A method of operating a time-interleaved sample and hold circuit apparatus comprising first and second shared circuits, each operative to charge a capacitance during opposite half-periods of a master clock signal, wherein each shared circuit is connected to two or more independently-activated sample and hold circuits, comprising:
   during a first half-period of a master clock signal, simultaneously configuring the first shared circuit to charge a first capacitance and the second shared circuit to sample an input voltage at one sample and hold circuit connected to it;
   during an immediately successive second half-period of the master clock signal, simultaneously configuring the second shared circuit to charge a second capacitance and the first shared circuit to sample an input voltage at one sample and hold circuit connected to it;
   wherein when either first or second shared circuit is sampling an input voltage at one sample and hold circuit connected to it, configuring the sample and hold circuit such that the respective first or second capacitance is connected between the input voltage and a gate terminal of a sampling transistor in the sample and hold circuit.

* * * * *